US009500725B2

(12) United States Patent
Bulatowicz

(10) Patent No.: US 9,500,725 B2
(45) Date of Patent: Nov. 22, 2016

(54) PROBE BEAM FREQUENCY STABILIZATION IN AN ATOMIC SENSOR SYSTEM

(71) Applicant: Michael D. Bulatowicz, Canoga Park, CA (US)

(72) Inventor: Michael D. Bulatowicz, Canoga Park, CA (US)

(73) Assignee: Northrop Grumman Systems Corporation, Falls Church, VA (US)

(*) Notice: Subject to any disclaimer, the term of this patent is extended or adjusted under 35 U.S.C. 154(b) by 643 days.

(21) Appl. No.: 13/960,127

(22) Filed: Aug. 6, 2013

(65) Prior Publication Data

US 2015/0042327 A1 Feb. 12, 2015

(51) Int. Cl.
G01R 33/26 (2006.01)
G01C 19/62 (2006.01)

(52) U.S. Cl.
CPC .............. *G01R 33/26* (2013.01); *G01C 19/62* (2013.01)

(58) Field of Classification Search
CPC ................................. G01R 33/26; G01C 19/62
See application file for complete search history.

(56) References Cited

U.S. PATENT DOCUMENTS

| 3,976,957 | A | | 8/1976 | Le Floch et al. | |
|---|---|---|---|---|---|
| 4,157,495 | A | * | 6/1979 | Grover | G01R 33/26 324/302 |
| 5,036,278 | A | | 7/1991 | Slocum | |
| 5,189,368 | A | * | 2/1993 | Chase | G01R 33/032 102/417 |

(Continued)

FOREIGN PATENT DOCUMENTS

| JP | 2009236599 A | 10/2009 |
|---|---|---|
| JP | 2011033629 A | 2/2011 |

(Continued)

OTHER PUBLICATIONS

Kerckhoff, et al.: "*A Frequency Stabilization Method for Diode Lasers Utilizing Low-Field Faraday Polarimetry*"; Review of Scientific Instruments 76, 093108 (2005) American Institute of Physics, 6 pgs.

(Continued)

*Primary Examiner* — G. M. Hyder
(74) *Attorney, Agent, or Firm* — Tarolli, Sundheim, Covell & Tummino LLP

(57) ABSTRACT

An atomic sensor system includes a magnetic field generator configured to generate a magnetic field along an axis and a probe laser configured to generate an optical probe beam. Beam optics direct the optical probe beam through a sensor cell comprising an alkali metal vapor such that the optical probe beam has at least a vector component along the axis. The system also includes detection optics comprising a photodetector assembly configured to measure a Faraday rotation associated with the optical probe beam exiting the sensor cell and to generate a feedback signal based on the Faraday rotation associated with the optical probe beam exiting the sensor cell. The system further includes a laser controller configured to modulate a frequency of the optical probe beam about a center frequency and to substantially stabilize the center frequency of the optical probe beam based on the feedback signal.

17 Claims, 4 Drawing Sheets

(56) References Cited

U.S. PATENT DOCUMENTS

| | | | |
|---|---|---|---|
| 7,902,927 B2 | 3/2011 | Davis et al. | |
| 8,000,767 B2 | 8/2011 | Eden et al. | |
| 8,421,455 B1 | 4/2013 | Hovde et al. | |
| 2007/0205767 A1* | 9/2007 | Xu | G01R 33/26 324/304 |
| 2010/0289491 A1* | 11/2010 | Budker | G01R 33/26 324/304 |
| 2011/0025323 A1 | 2/2011 | Budker et al. | |
| 2011/0057737 A1* | 3/2011 | Aoyama | G04F 5/145 331/94.1 |
| 2011/0109395 A1* | 5/2011 | Chindo | G04F 5/145 331/94.1 |
| 2012/0001625 A1 | 1/2012 | Yamada et al. | |
| 2013/0038324 A1 | 2/2013 | Wu et al. | |
| 2013/0328557 A1* | 12/2013 | Larsen | G01R 33/26 324/304 |

FOREIGN PATENT DOCUMENTS

| | | |
|---|---|---|
| JP | 2012042237 A | 3/2012 |
| WO | WO 2009/073256 A2 | 6/2009 |

OTHER PUBLICATIONS

Marchant, et al.: "Off-Resonance Laser Frequency Stabilization Using the Faraday Effect"; *Optics letters* 36.1 (2011): 64-66.
Office Action for corresponding JP 2014-157714 dated Mar. 29, 2016.

\* cited by examiner

PROBE BEAM FREQUENCY STABILIZATION IN AN ATOMIC SENSOR SYSTEM

TECHNICAL FIELD

The present invention relates generally to sensor systems, and specifically to probe beam frequency stabilization in an atomic sensor system.

BACKGROUND

Atomic sensors, such as nuclear magnetic resonance (NMR) gyroscopes and atomic magnetometers, employ optical beams to operate, such as to detect rotation about a sensitive axis or to detect the presence and magnitude of an external magnetic field. As an example, an NMR sensor system can employ a first optical beam as a pump beam. For example, the pump beam can be a circularly-polarized optical beam that is configured to spin-polarize an alkali metal vapor, such as cesium (Cs) or rubidium (Rb), within a sealed cell of the sensor. The NMR sensor system can also employ a second optical beam as a probe beam. For example, the probe beam can be a linearly-polarized optical beam that is configured to indirectly detect precession of noble gas isotopes, such as xenon (Xe), based on the directly measured precession of the alkali metal, such as for detecting rotation of the detection system about the sensitive axis or detecting the magnitudes of the external magnetic field.

SUMMARY

An atomic sensor system includes a magnetic field generator configured to generate a magnetic field along an axis and a probe laser configured to generate an optical probe beam. Beam optics direct the optical probe beam through a sensor cell comprising an alkali metal vapor such that the optical probe beam has at least a vector component along the axis. The system also includes detection optics comprising a photodetector assembly configured to measure a Faraday rotation associated with the optical probe beam exiting the sensor cell and to generate a feedback signal based on the Faraday rotation associated with the optical probe beam exiting the sensor cell. The system further includes a laser controller configured to modulate a frequency of the optical probe beam about a center frequency and to substantially stabilize the center frequency of the optical probe beam based on the feedback signal.

Another embodiment includes a method for stabilizing a frequency of an optical probe beam in a nuclear magnetic resonance (NMR) system. The method includes modulating the frequency of the optical probe beam about a center frequency based on a modulation signal and generating a magnetic field along an axis. The method also includes directing the optical probe beam through a sensor cell of the NMR system comprising an alkali metal vapor such that the optical probe beam has at least a vector component along the axis and measuring a Faraday rotation associated with the optical probe beam exiting the sensor cell. The method also includes generating a feedback signal based on the Faraday rotation associated with the optical probe beam exiting the sensor cell. The method further includes demodulating the optical probe beam exiting the sensor cell based on the modulation signal, and stabilizing the center frequency of the optical probe beam based on the feedback signal.

Another embodiment includes an atomic sensor system. The system includes a magnetic field generator configured to generate a magnetic field along an axis and a pump laser configured to generate an optical pump beam along the axis through a sensor cell comprising an alkali metal vapor. The system also includes a probe laser configured to generate an optical probe beam and beam optics configured to split the optical probe beam into a first portion and a second portion, and to direct the first portion through the sensor cell substantially orthogonally with respect to the axis. The system also includes a beam combiner configured to combine the second portion of the optical probe beam with the optical pump beam, such that the second portion of the optical probe beam and the optical pump beam are provided substantially collinearly through the sensor cell along the axis. The system also includes a first photodetector assembly configured to measure at least one characteristic associated with the first portion of the optical probe beam exiting the sensor cell for measurement of at least one of an external magnetic field, a spin precession frequency or phase, and a rotation of the atomic sensor system about a sensitive axis. The system also includes a second photodetector assembly configured to measure a Faraday rotation associated with the second portion of the optical probe beam exiting the sensor cell and to generate a feedback signal based on the Faraday rotation associated with the optical probe beam exiting the sensor cell. The system further includes a laser controller configured to modulate a frequency of the optical probe beam about a center frequency and to substantially stabilize the center frequency of the optical probe beam based on the feedback signal.

DETAILED DESCRIPTION

The present invention relates generally to sensor systems, and specifically to probe beam frequency stabilization in an atomic sensor system. The NMR sensor system can be implemented, for example, as an NMR gyroscope or an atomic magnetometer. The NMR probe system includes a pump laser configured to generate an optical pump beam and a probe laser configured to generate an optical probe beam. The optical pump beam can be provided through the sensor cell, such as via beam optics, to stimulate the alkali metal vapor therein, and a first portion of the optical probe beam can be provided through the sensor cell orthogonally relative to the optical pump beam to measure a characteristic of the optical probe beam in response to polarization of the alkali metal vapor, which can be modulated in response to precession of noble gas isotopes based on the interaction of the alkali metal vapor with the noble gas isotopes. Thus, the optical probe beam can be implemented to measure rotation about a sensitive axis, in the example of the NMR gyroscope, or to measure a magnitude of an external magnetic field, in the example of the atomic magnetometer.

The second portion of the optical probe beam can be provided through the sensor cell in such a manner as to have at least a vector component along an axis defined by an applied magnetic field for stabilizing a wavelength of the optical probe beam. As an example, a beam combiner can be implemented to combine the second portion of the optical probe beam to be collinear with the optical pump beam, such that the optical probe beam is provided along the axis with the optical pump beam. The second portion of the optical probe beam exiting the sensor cell can be provided to a polarizing beam-splitter configured to split the second portion of the optical probe beam into two orthogonally polarized portions that are provided to respective photodetectors. Each of the photodetectors can provide intensity signals that can form a feedback signal based on an intensity difference that is indicative of a Faraday rotation of the second portion of the optical probe beam that is wavelength dependent. The Faraday rotation can be detected based on frequency modulating the optical probe beam, such that changes in the intensity after demodulation can correspond to an off-peak Faraday rotation. Accordingly, a laser controller can stabilize the center frequency of the optical probe beam based on the feedback signal.

Figure 1:
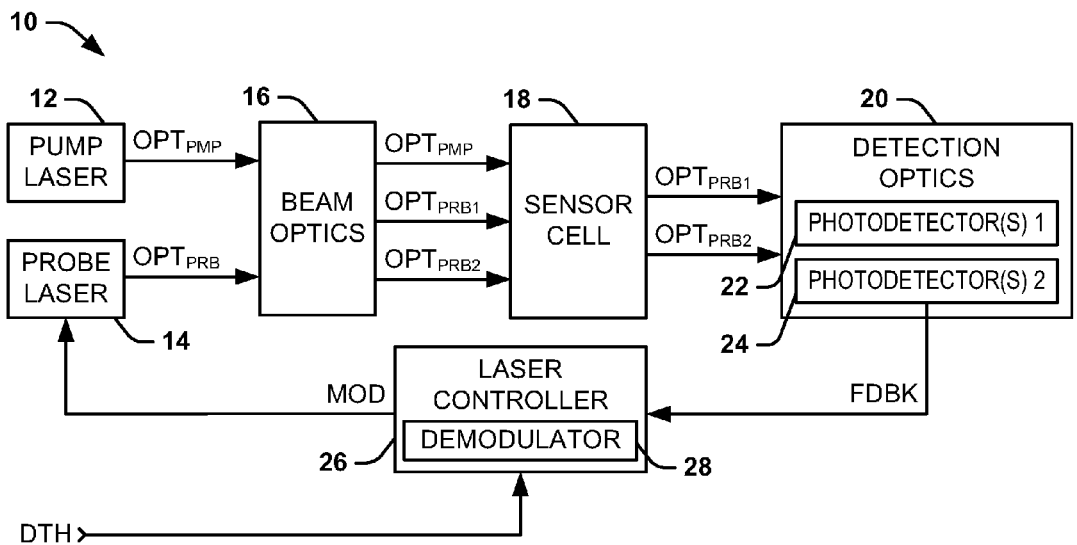
FIG. 1 illustrates an example of an atomic sensor system.

FIG. 1 illustrates an example of an atomic sensor system 10. The atomic sensor system 10 can correspond to any of a variety of NMR sensors, such as an NMR gyroscope that is configured to measure rotation about a sensitive axis or an atomic magnetometer that is configured to measure a magnitude of an externally provided magnetic field. The atomic sensor system 10 can thus be provided in any of a variety of applications, such as navigation and/or defense applications.

The atomic sensor system 10 includes a pump laser 12 configured to generate an optical pump beam $OPT_{PMP}$ and a probe laser 14 configured to generate an optical probe beam $OPT_{PRB}$. As an example, the optical pump beam $OPT_{PMP}$ and the optical probe beam $OPT_{PRB}$ can be generated at separate wavelengths, such as corresponding to D1 and D2 emission lines associated with an alkali metal vapor, respectively. The optical pump beam $OPT_{PMP}$ and the optical probe beam $OPT_{PRB}$ are each provided to a set of beam optics 16 that is configured to direct each of the optical pump beam $OPT_{PMP}$ and the optical probe beam $OPT_{PRB}$ into a sensor cell 18. In the example of FIG. 1, the beam optics 16 are also configured to split the optical probe beam $OPT_{PRB}$ into two separate portions, demonstrated as a first portion $OPT_{PRB1}$ and a second portion $OPT_{PRB2}$. For example, the set of beam optics 16 can provide the optical pump beam $OPT_{PMP}$ and the first portion $OPT_{PRB1}$ along orthogonal axes with respect to each other through the sensor cell 18, and can provide the second portion $OPT_{PRB2}$ to have at least a vector component parallel with the optical pump beam $OPT_{PMP}$ (e.g., parallel with a sensitive axis along which a magnetic field is provided). In addition, the set of beam optics 16 can include polarization components configured to polarize (e.g., circularly polarize) the optical pump beam $OPT_{PMP}$ and to polarize (e.g., linearly polarize) the optical probe beam $OPT_{PRB}$ before or after being split into the first and second portions $OPT_{PRB1}$ and $OPT_{PRB2}$, respectively.

As an example, the sensor cell 18 can be configured as a sealed cell having a transparent or translucent casing that includes an alkali metal vapor (e.g., cesium (Cs) or rubidium (Rb)) and can include a noble gas isotope (e.g., argon (Ar) or xenon (Xe)). The wavelengths of the optical pump beam $OPT_{PMP}$ and $OPT_{PRB}$ could thus correspond to at least one of the D1 and D2 emission lines of the alkali metal vapor in the sensor cell 18. The sensor cell 18 can thus comprise the operative physics portion of the atomic sensor system 10. Specifically, the optical pump beam $OPT_{PMP}$ can be provided through the sensor cell 18 to spin-polarize the alkali metal vapor therein. As an example, noble gas isotopes within the sensor cell 18 can precess in the presence of an external magnetic field, such that the spin-polarized alkali metal vapor particles can have their spin-polarization modulated such that a component of the net spin polarization is aligned with the precessing noble gas isotopes. The precession of the noble gas isotopes can thus be measured by the first portion of the optical probe beam $OPT_{PRB1}$, such as based on measuring a Faraday rotation of the linearly-polarized first portion of the optical probe beam $OPT_{PRB1}$ exiting the sensor cell 18 based on a projection of the spin-polarization of the alkali metal vapor in the sensor cell 18 along the axis orthogonal to the optical pump beam $OPT_{PMP}$. Accordingly, a rotation of the atomic sensor system 10, a magnitude of an external magnetic field, or a spin precession frequency or phase can be measured in response to determining the precession of the noble gas isotopes.

The atomic sensor system 10 also includes detection optics 20 that are configured to receive the first and second portions $OPT_{PRB1}$ and $OPT_{PRB2}$ exiting the sensor cell 18. The detection optics can thus measure at least one characteristic associated with each of the first and second portions $OPT_{PRB1}$ and $OPT_{PRB2}$. For example, the at least one characteristic of each of the first and second portions $OPT_{PRB1}$ and $OPT_{PRB2}$ exiting the sensor cell 18 can include a Faraday rotation. In the example of FIG. 1, the detection optics 20 includes at least one photodetector 22. The photodetector(s) 22 can be configured to measure an intensity of the first portion $OPT_{PRB1}$ exiting the sensor cell 18. For example, the detection optics 20 could include a polarizing beam-splitter configured to separate the first portion $OPT_{PRB1}$ exiting the sensor cell 18 into orthogonally polarized components. Therefore, the photodetector(s) 22 can measure a relative separate intensity of the orthogonally polarized components to determine the Faraday rotation of the first portion $OPT_{PRB1}$ exiting the sensor cell 18.

Figure 2:
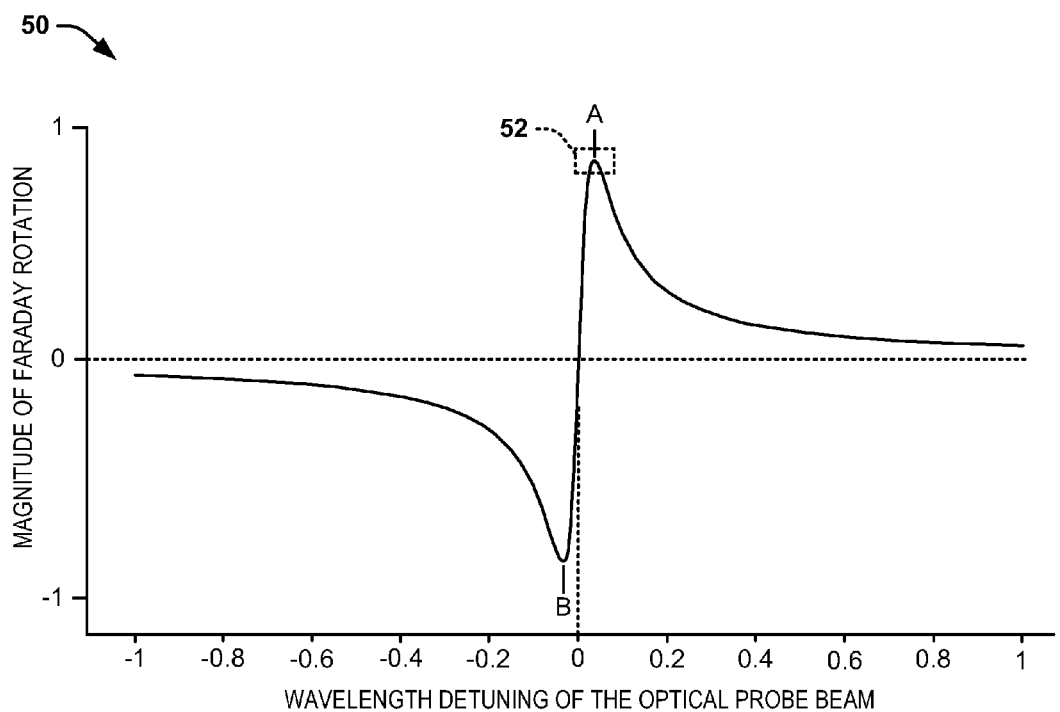
FIG. 2 illustrates an example of a graph of Faraday rotation as a function of wavelength.

FIG. 2 illustrates an example of a graph 50 of Faraday rotation as a function of wavelength. The graph 50 demonstrates a magnitude of Faraday rotation on the vertical axis, centered about zero, and a wavelength detuning of the optical probe beam $OPT_{PRB}$ from resonance of the alkali metal vapor in the sensor cell 18, both in arbitrary units. As described previously, the Faraday rotation of the first portion of the optical probe beam $OPT_{PRB1}$ can be measured to determine, for example, a rotation of the atomic sensor system 10 or a magnitude of an external magnetic field. However, as demonstrated by the graph 50, the Faraday rotation of the optical probe beam $OPT_{PRB}$ can be strongly dependent on the wavelength of the optical probe beam $OPT_{PRB}$. Therefore, if the wavelength of the optical probe beam $OPT_{PRB}$ is unstable, then the Faraday rotation of the first portion of the optical probe beam $OPT_{PRB1}$ will be affected, which can thus provide errors in the measurement of the rotation of the atomic sensor system 10 or the magnitude of the external magnetic field. Accordingly, the atomic sensor system 10 can stabilize the wavelength of the optical probe beam $OPT_{PRB}$ based on measuring a Faraday rotation of the second portion of the optical probe beam $OPT_{PRB2}$.

Referring back to the example of FIG. 1, the detection optics 20 includes at least one photodetector 24 configured to measure an intensity of the second portion $OPT_{PRB2}$ exiting the sensor cell 18. For example, the detection optics 20 could include a polarizing beam-splitter configured to separate the second portion $OPT_{PRB2}$ exiting the sensor cell 18 into orthogonally polarized components. Therefore, the photodetector(s) 24 can measure a relative separate intensity of the orthogonally polarized components to determine the Faraday rotation of the second portion $OPT_{PRB2}$ exiting the sensor cell 18. As described previously, the second portion $OPT_{PRB2}$ can be provided through the sensor cell 18 such that at least a vector component of the second portion $OPT_{PRB2}$ can be parallel with the optical pump beam $OPT_{PMP}$. For example, the beam optics 16 can include a beam combiner, such that the second portion $OPT_{PRB2}$ can be provided substantially collinearly with respect to the optical pump beam $OPT_{PMP}$. Therefore, the Faraday rotation of the second portion $OPT_{PRB2}$ can be measured based on a substantially larger projection of the spin-polarization of the alkali metal vapor in the sensor cell 18 along the axis of the optical pump beam $OPT_{PMP}$ relative to the axis of the first portion $OPT_{PRB1}$.

In the example of FIG. 1, the photodetector(s) 24 are configured to generate a feedback signal FDBK that is indicative of the measured Faraday rotation of the second portion $OPT_{PRB2}$ exiting the sensor cell 18. The feedback signal FDBK is provided to a laser controller 26 that is configured to control the probe laser 14 via a signal MOD. As an example, the signal MOD can correspond to a current that is provided to the probe laser 14 to control a frequency of the probe laser 14. The laser controller 26 can thus provide the signal MOD to stabilize the wavelength of the probe laser 14 based on the feedback signal FDBK. As an example, the laser controller 26 can be configured to modulate the frequency of the optical probe beam $OPT_{PRB}$ about a center frequency via the signal MOD, such as based on a modulation signal DTH having a substantially stable frequency. Thus, the laser controller 26 can also include a demodulator 28 that is configured to demodulate the feedback signal FDBK, likewise based on the modulation signal DTH. Therefore, the laser controller 26 can control the probe laser 14 to stabilize the wavelength of the optical probe beam $OPT_{PRB}$ (e.g., corresponding to the center frequency) to a predetermined wavelength that corresponds to a predetermined magnitude of Faraday rotation. For example, the predetermined wavelength can correspond to a wavelength associated with a peak Faraday rotation of the optical probe beam $OPT_{PRB}$.

Therefore, by controlling the probe laser 14 in a feedback manner to stabilize the wavelength of the optical probe beam $OPT_{PRB}$ based on the Faraday rotation dependence on wavelength, the atomic sensor system 10 can achieve more accurate measurements. For example, the atomic sensor system 10 can operate to measure rotation about a sensitive axis, in the example of the atomic sensor system 10 being implemented as an NMR gyroscope, or can operate to measure the magnitude of an external magnetic field, in the example of the atomic sensor system 10 being implemented as an atomic magnetometer, with substantially minimal error resulting from an unstable wavelength of the optical probe beam $OPT_{PRB}$ (e.g., based on temperature, process, or signal variation). Accordingly, the atomic sensor system 10 can be implemented accurately with minimal additional components.

Figure 3:
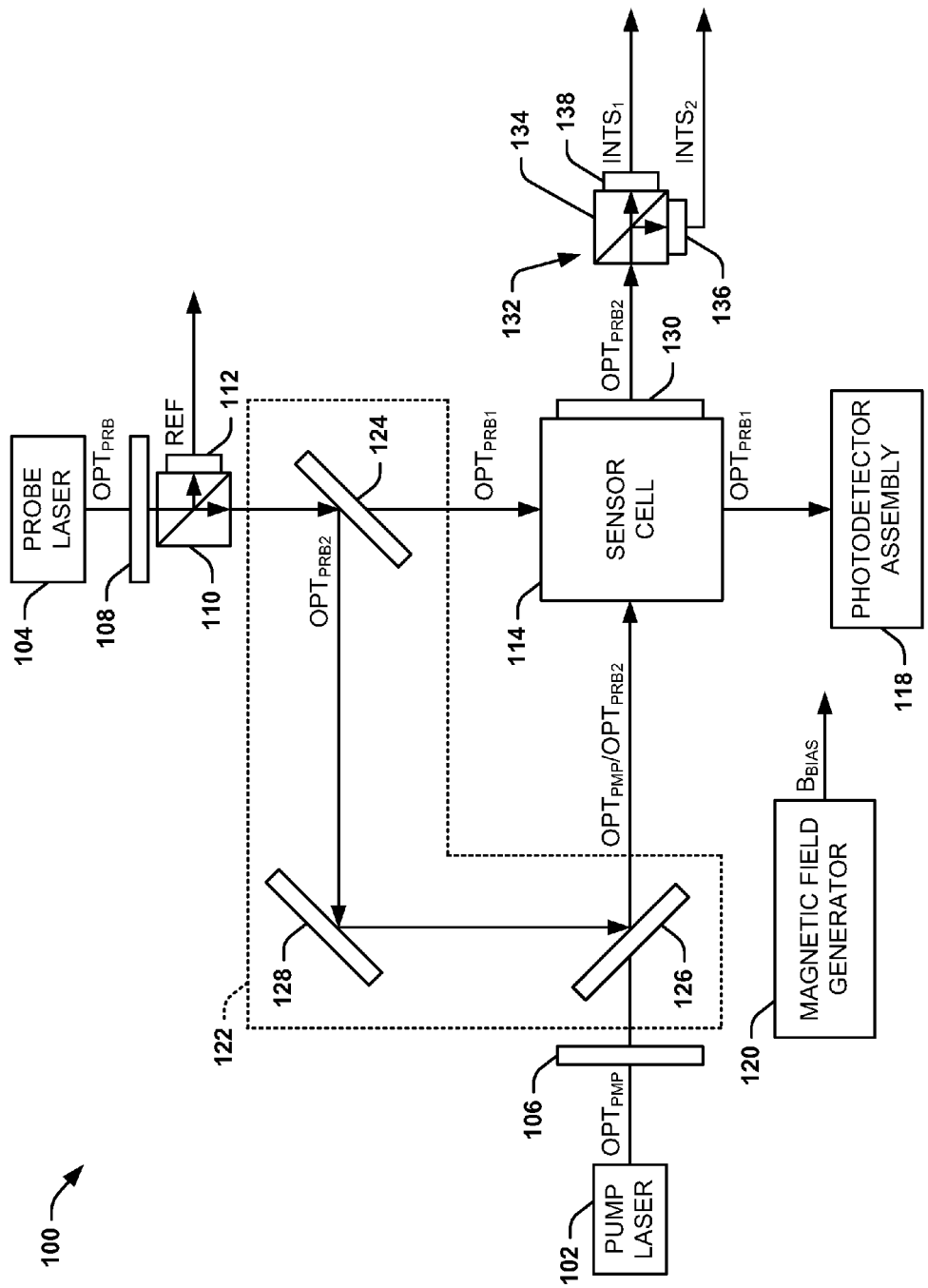
FIG. 3 illustrates another example of an NMR sensor system.

FIG. 3 illustrates another example of an atomic sensor system 100. As an example, the atomic sensor system 100 can correspond to a portion of an NMR gyroscope system or an atomic magnetometer. As an example, the atomic sensor system 100 can correspond to a portion of the atomic sensor system 10 in the example of FIG. 1. Therefore, reference is to be made to the example of FIG. 1 in the following description of the example of FIG. 3.

The atomic sensor system 100 includes a pump laser 102 configured to generate an optical pump beam $OPT_{PMP}$ and a probe laser 104 configured to generate an optical probe beam $OPT_{PRB}$. As an example, the pump laser 102 and the probe laser 104 can each include collimating optics to generate the respective optical pump beam $OPT_{PMP}$ and optical probe beam $OPT_{PRB}$. As an example, the optical pump beam $OPT_{PMP}$ and the optical probe beam $OPT_{PRB}$ can be generated at separate wavelengths, such as corresponding to D1 and D2 emission lines associated with an alkali metal vapor, respectively. The optical pump beam $OPT_{PMP}$ is provided to a polarizer 106 that is configured to convert the optical pump beam $OPT_{PMP}$ to a circular polarization. As an example, the polarizer 106 can include a linear polarizer followed by a quarter-wave plate that can convert the optical pump beam $OPT_{PMP}$ to the circular polarization. The optical probe beam $OPT_{PRB}$ is provided to a polarizer 108 that can be configured as a half-wave plate and a linear polarizer configured to convert the optical probe beam $OPT_{PRB}$ to a linear polarization of a desired orientation. In the example of FIG. 3, the polarizers 106 and 108 can correspond to a portion of the beam optics 16 in the example of FIG. 1.

The atomic sensor system 100 includes a polarizing beam-splitter 110 that is configured to split the optical probe beam $OPT_{PRB}$ into two orthogonal components. As an example, the polarizer 108 and/or the polarizing beam-splitter 110 can be intentionally misaligned to allow separation of the optical probe beam $OPT_{PRB}$ into the separate orthogonal linearly-polarized components, or can rely on an inherently imperfect quality of the polarizing beam-splitter. A first and relatively much greater portion is provided through the polarizing beam-splitter 110. A relatively much smaller portion of the optical probe beam $OPT_{PRB}$ is diverted in an orthogonal direction from the larger portion of the optical probe beam $OPT_{PRB}$ to be received at a photodetector 112. The photodetector 112 is configured to generate a reference signal REF corresponding to a reference intensity of the optical probe beam $OPT_{PRB}$. As an example, the reference signal REF can be provided to the laser controller 26 to provide a baseline reference intensity for the probe laser 104.

The atomic sensor system 100 includes a sensor cell 114 that can include an alkali metal vapor and a noble gas isotope, similar to as described previously in the example of FIG. 1. Similar to as described previously, the optical pump beam $OPT_{PMP}$ can be provided through the sensor cell 114 to spin-polarize the alkali metal vapor therein. The portion of the linearly-polarized optical probe beam $OPT_{PRB}$ can experience a Faraday rotation as it passes through the sensor cell 114 based on the net spin polarization vector of the alkali metal vapor, with modulation of such Faraday rotation corresponding to the precession of the noble gas isotopes in the sensor cell 114, similar to as described previously. Therefore, the Faraday rotation of a first portion of the optical probe beam $OPT_{PRB1}$ exiting the sensor cell 114 can be measured by a photodetector assembly 118, similar to as described previously.

In the example of FIG. 3, the atomic sensor system 100 further includes a magnetic field generator 120 configured to generate a bias magnetic field $B_{BIAS}$ that is provided through the sensor cell 114 in a direction that is substantially parallel with the optical pump beam $OPT_{PMP}$. The bias magnetic field $B_{BIAS}$ can be configured to stimulate precession of the alkali metal vapor in the sensor cell 114 in a resonant condition to substantially amplify the modulation of the polarization vector of the alkali metal vapor in the sensor cell 114 in response to magnetic fields applied orthogonally with respect to the optical pump beam $OPT_{PMP}$ (e.g., external orthogonal magnetic field components). Therefore, in response to the measured Faraday rotation associated with the first portion of the optical probe beam $OPT_{PRB1}$ at the first photodetector assembly 118, the first photodetector assembly 118 and associated signal processing electronics (not shown) can adjust the magnetic fields orthogonal to the optical pump beam $OPT_{PMP}$ in a closed-loop feedback manner based on a signal $FDBK_1$, such that these orthogonal magnetic fields can be maintained at substantially zero magnetic flux.

In addition, the atomic sensor system 100 includes a beam combiner 122 configured to split the optical probe beam $OPT_{PRB}$ into the first portion $OPT_{PRB1}$ and a second portion $OPT_{PRB2}$, and to combine the second portion of the optical probe beam $OPT_{PRB2}$ with the optical pump beam $OPT_{PMP}$ in the same optical path. Therefore, the portion of the optical probe beam $OPT_{PRB}$ and the optical pump beam $OPT_{PMP}$ can be provided substantially collinearly through the sensor cell 114. As an example, the beam combiner 122 can be included in the set of beam optics 16 in the example of FIG. 1. In the example of FIG. 3, the beam combiner 122 includes an optical pickoff 124 that is configured to separate the optical probe beam $OPT_{PRB}$ into the two portions, such that the first portion of the optical probe beam $OPT_{PRB1}$ passes through the sensor cell 114 orthogonally with respect to the magnetic field $B_{BIAS}$ and the optical pump beam $OPT_{PMP}$, as described previously. As an example, the optical pickoff 124 can be configured as a partially-reflecting mirror, a polarization-sensitive beam-splitter, or any of a variety of polarization-insensitive beam-splitters. The second portion of the optical probe beam $OPT_{PRB2}$ is reflected to a dichromatic mirror 126 via a mirror 128 that is arranged in the optical path of the optical pump beam $OPT_{PMP}$. Therefore, the optical pump beam $OPT_{PMP}$ and the second portion of the optical probe beam $OPT_{PRB2}$ are provided through the sensor cell 114 substantially collinearly.

In the example of FIG. 3, the atomic sensor system 100 also includes a dichromatic mirror 130 that is arranged at a distal end of the sensor cell 114. The dichromatic mirror 130 can be configured to reflect the optical pump beam $OPT_{PMP}$ and to pass the second portion of the optical probe beam $OPT_{PRB2}$. For example, the optical pump beam $OPT_{PMP}$ can have a first wavelength and the optical probe beam $OPT_{PRB}$ can have a second wavelength that is different from the first wavelength. Therefore, the dichromatic mirror 130 can reflect light having the first wavelength (e.g., a D1 emission line of the alkali metal vapor) and pass light having the second wavelength (e.g., a D2 emission line of the alkali metal vapor). Therefore, the dichromatic mirror 130 is configured to reflect the optical pump beam $OPT_{PMP}$ back through the sensor cell 114, such as to stabilize the optical pump beam $OPT_{PMP}$, and to pass the second portion of the optical probe beam $OPT_{PRB}$ through the dichromatic mirror 130 to a second photodetector assembly 132.

As described previously, the second portion of the optical probe beam $OPT_{PRB2}$ can undergo a Faraday rotation based on the net alkali spin polarization vector component parallel to and aligned with the magnetic field $B_{BIAS}$. The magnitude of the net spin vector can further be proportional to the alkali metal vapor number density and fractional polarization. As a result, the closed-loop feedback maintaining the orthogonal magnetic fields at substantially zero can ensure that the net spin polarization vector remains substantially oriented parallel to the optical pump beam $OPT_{PMP}$. Therefore, similar to as described previously, the probe laser 104 can be controlled (e.g., by the laser controller 26) to stabilize the wavelength of the optical probe beam $OPT_{PRB}$ based on a measurement of the Faraday rotation of the second portion of the optical probe beam $OPT_{PRB2}$.

In the example of FIG. 3, the second photodetector assembly 132 includes a polarizing beam-splitter 134 configured to separate the second portion of the optical probe beam $OPT_{PRB2}$ exiting the sensor cell 114 into orthogonal polarizations. The second photodetector assembly 132 also includes a first photodetector 136 and a second photodetector 138 that are associated with the respective orthogonal polarizations. The first photodetector 136 is configured to generate a first intensity signal $INTS_1$ and the second photodetector 138 is configured to generate a second intensity signal $INTS_2$ that can each correspond to an intensity of the respective orthogonal components of the second optical probe beam $OPT_{PRB2}$. Therefore, a difference between the first and second intensity signals $INTS_1$ and $INTS$ 2 can correspond to a Faraday rotation of the second portion of the optical probe beam $OPT_{PRB2}$. Therefore, the second photodetector assembly 132 can be configured to measure a Faraday rotation associated with the second portion of the optical probe beam $OPT_{PRB2}$. Accordingly, the first and second intensity signals $INTS_1$ and $INTS_2$ can collectively correspond to the feedback signal FDBK that is provided to the laser controller 26 in the example of FIG. 1.

The laser controller 26 can implement the feedback signal FDBK to stabilize the wavelength of the probe laser 104, such as to maintain a center frequency of a modulated frequency of the probe laser 104 at a substantially stable wavelength. As an example, the laser controller 26 can maintain the center frequency at a wavelength that is detuned from a resonant frequency, such that the detuned center frequency is associated with a wavelength of a peak Faraday rotation of the optical probe beam $OPT_{PRB}$. For example, referring to the example of FIG. 2, the laser controller 26 can maintain the center frequency at a wavelength of a peak "A" or a peak "B" associated with a positive or negative Faraday rotation, respectively, of the second portion of the optical probe beam $OPT_{PRB2}$. Therefore, the frequency of the optical probe beam $OPT_{PRB}$ can be modulated about the center frequency, such that variations in the center frequency can be detected based on variations in the Faraday rotation of the second portion of the optical probe beam $OPT_{PRB2}$.

Figure 4:
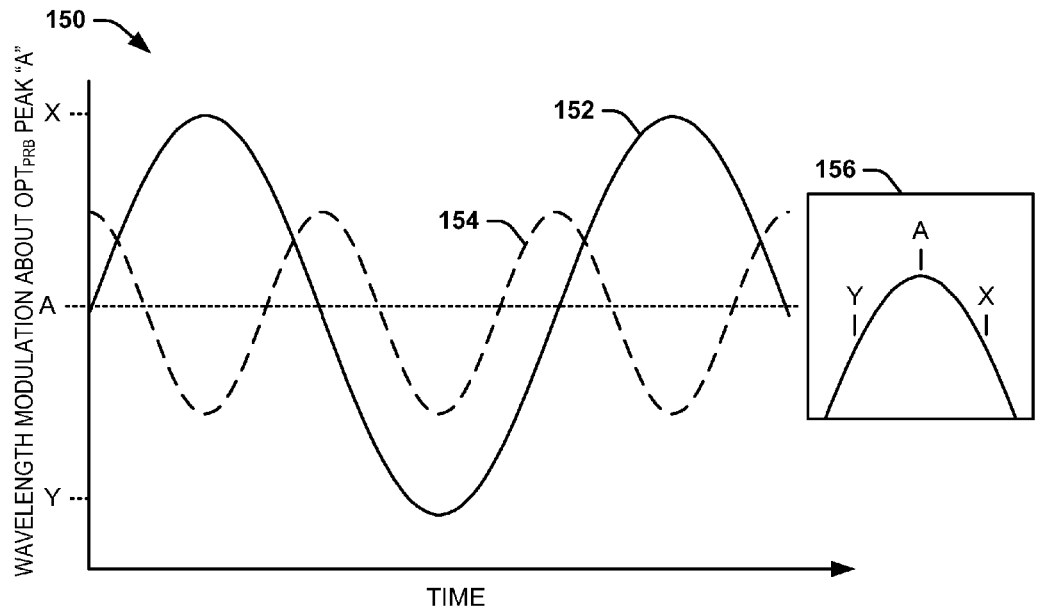
FIG. 4 illustrates an example of a timing diagram.
Figure 5:
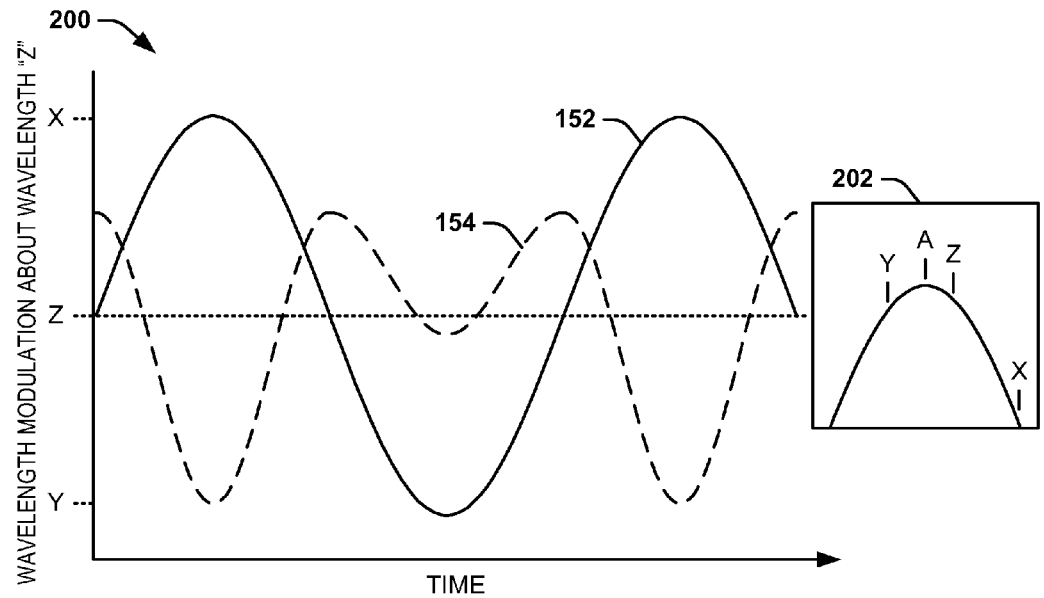
FIG. 5 illustrates another example of a timing diagram.

FIG. 4 illustrates an example of a timing diagram 150 and FIG. 5 illustrates another example of a timing diagram 200. The timing diagrams 150 and 200 demonstrate the modulated wavelength of the optical probe beam $OPT_{PRB}$ at 152 (i.e., a solid line), which can correspond to the stable reference frequency of the modulation signal DTH that is provided to the laser controller 26. The timing diagram 150 also demonstrates a difference between the first and second intensity signals $INTS_1$ and $INTS_2$ at 154 (i.e., a dashed line) superimposed on the modulated wavelength 152. The signal 154 can thus correspond to the feedback signal FDBK, and thus to the Faraday rotation of the second portion of the optical probe beam $OPT_{PRB2}$. The frequency of the signal 154 is demonstrated at approximately twice the modulated wavelength 152. Thus, when the signal 154 is demodulated using the modulated wavelength 152, the output from the demodulator 28 is substantially zero.

In the example of FIG. 4, the center frequency of the optical probe beam $OPT_{PRB}$ is held at a wavelength of an approximate peak of the Faraday rotation of the second optical probe beam $OPT_{PRB2}$ exiting the sensor cell 114. In the example of FIG. 4, the wavelength of the center frequency of the optical probe beam $OPT_{PRB}$ is held at a peak "A" (e.g., corresponding to the peak "A" in the example of FIG. 2), as demonstrated by the inset 156, which corresponds to the portion 52 in the example of FIG. 2. The wavelength is thus modulated between the wavelengths "X" and "Y" in the inset 156. Therefore, the Faraday rotation of the second optical probe beam $OPT_{PRB2}$ changes approximately equally as the modulated wavelength 152 of the optical probe beam $OPT_{PRB}$ increases and decreases.

In the example of FIG. 5, the center frequency of the optical probe beam $OPT_{PRB}$ is held at a wavelength of that is offset from the approximate peak of the Faraday rotation of the second optical probe beam $OPT_{PRB2}$ exiting the sensor cell 114. In the example of FIG. 5, the wavelength of the center frequency of the optical probe beam $OPT_{PRB}$ is at a wavelength "Z" that is slightly greater than the wavelength of the peak "A" demonstrated by the inset 202, which corresponds to the portion 52 in the example of FIG. 2, and which is modulated between the wavelengths "X" and "Y". Therefore, the Faraday rotation of the second optical probe beam $OPT_{PRB2}$ changes disproportionally between the wavelengths "X" and "Y", such that the Faraday rotation of the second portion of the optical probe beam $OPT_{PRB2}$ decreases differently between the positive and negative peaks of the modulated wavelength 152. Accordingly, the laser controller 26 can detect such variation in the Faraday rotation based on demodulating the feedback signal FDBK (e.g., the signal 154) using the modulated wavelength 152 via the demodulator 28 to adjust and stabilize the center frequency of the optical probe beam $OPT_{PRB}$, such as back to the peak "A". It is to be understood that such an offset from the peak "A" at a wavelength that is less than "A" would result in a substantially similar signal 154 that would instead be phase-shifted 360° relative to the signal 154.

It is to be understood that the atomic sensor system 100 is not intended to be limited to the example of FIG. 3. As an example, the second portion of the optical probe beam $OPT_{PRB2}$ is not limited to being provided substantially collinearly with the optical pump beam $OPT_{PMP}$. For example, the second portion of the optical probe beam $OPT_{PRB2}$ can be provided at an offset angle between the optical pump beam $OPT_{PMP}$ and the first portion of the optical probe beam $OPT_{PRB1}$. As another example, the optical probe beam $OPT_{PRB}$ is not limited to being split into the separate respective portions, but could instead be provided at the offset angle for measurement of Faraday rotation to both stabilize the wavelength of the optical probe beam $OPT_{PRB}$ and to measure the rotation or magnetic field. Accordingly, the atomic sensor system 10 can be configured in a variety of different ways.

Figure 6:
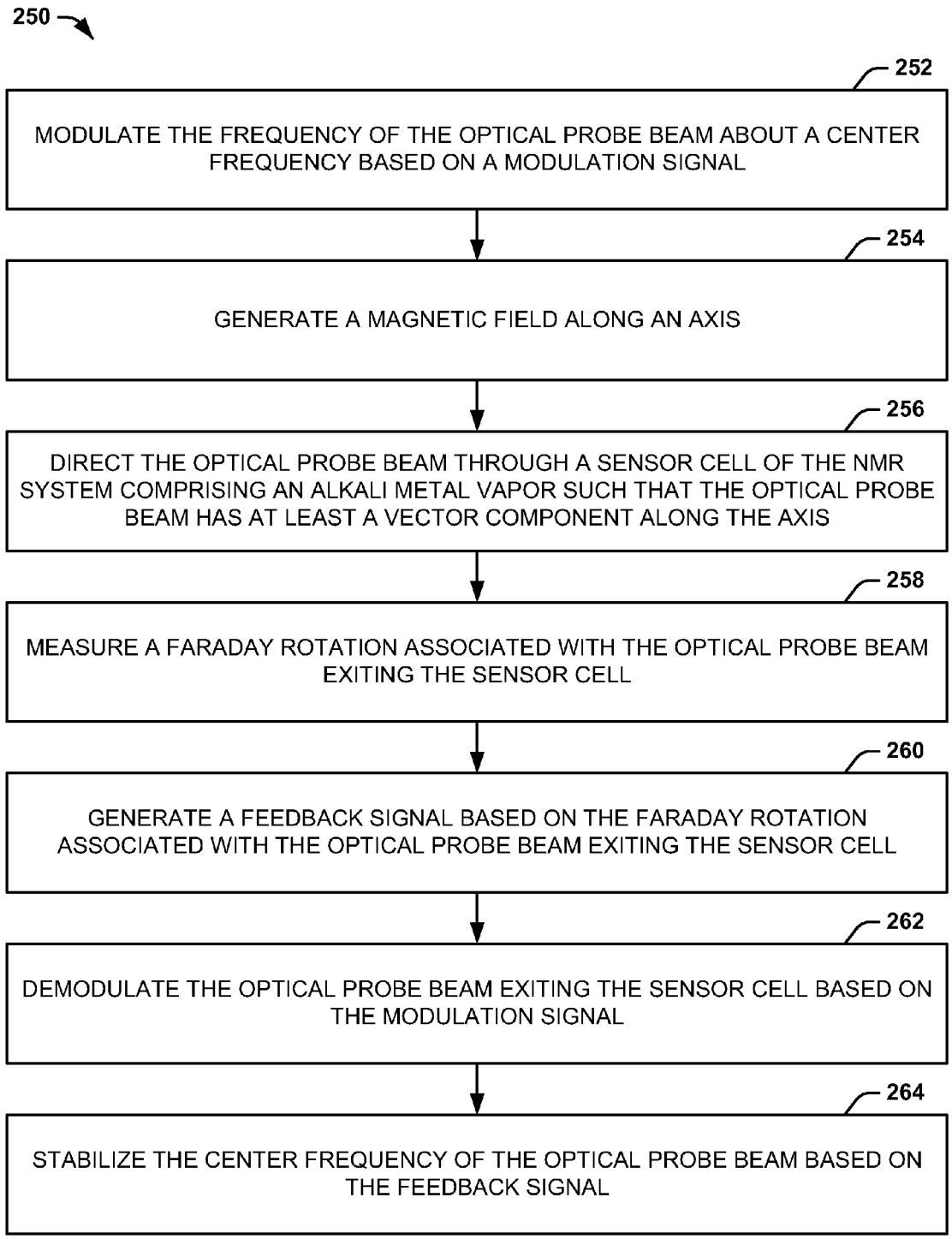
FIG. 6 illustrates an example of a method for stabilizing a frequency of an optical probe beam in an atomic sensor system.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 250 for stabilizing a frequency of an optical probe beam (e.g., the optical probe beam $OPT_{PRB}$) in an atomic sensor system (e.g., the atomic sensor system 10). At 252, the frequency of the optical probe beam is modulated about a center frequency based on a modulation signal (e.g., the modulation signal DTH). At 254, a magnetic field (e.g., the magnetic field $B_{BIAS}$) is generated along an axis. At 256, the optical probe beam is directed through a sensor cell (e.g., the sensor cell 18) of the NMR system comprising an alkali metal vapor such that the optical probe beam has at least a vector component along the axis. At 258, a Faraday rotation associated with the optical probe beam exiting the sensor cell (e.g., the second portion of the optical probe beam $OPT_{PRB2}$) is measured. At 260, a feedback signal (e.g., the feedback signal FDBK) is generated based on the Faraday rotation associated with the optical probe beam exiting the sensor cell. At 262, the optical probe beam exiting the sensor cell is demodulated based on the modulation signal. At 264, the center frequency of the optical probe beam is stabilized based on the feedback signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An atomic sensor system comprising:
   a magnetic field generator configured to generate a magnetic field along an axis;
   a probe laser configured to generate an optical probe beam;
   a pump laser configured to generate an optical pump beam along the axis;
   beam optics configured to direct the optical probe beam through a sensor cell comprising an alkali metal vapor such that the optical probe beam has at least a vector component along the axis;
   detection optics comprising a photodetector assembly configured to measure a Faraday rotation associated with the optical probe beam exiting the sensor cell and to generate a feedback signal based on the Faraday rotation associated with the optical probe beam exiting the sensor cell; and
   a laser controller configured to modulate a frequency of the optical probe beam about a center frequency and to substantially stabilize the center frequency of the optical probe beam based on the feedback signal.

2. The system of claim 1, wherein the beam optics comprise a beam combiner configured to combine at least a portion of the optical probe beam with the optical pump beam, such that at least a portion of the optical probe beam and the optical pump beam are provided substantially collinearly through the sensor cell along the axis.

3. The system of claim 2, wherein the beam combiner comprises:
   an optical pickoff configured to split a portion of the optical probe beam from a first optical path that passes through the sensor cell in a first axis; and
   a beam combining element configured to pass the optical pump beam and to reflect the portion of the optical probe beam into a second optical path that comprises the optical pump beam and passes through the sensor cell in a second axis orthogonal to the first axis.

4. The system of claim 1, wherein a portion of the optical probe beam is directed through the sensor cell approximately orthogonally relative to the axis, the detection optics further comprising a second photodetector assembly configured to measure at least one characteristic associated with the at least a portion of the optical probe beam exiting the sensor cell for measurement of at least one of an external magnetic field, a spin precession frequency or phase, and a rotation of the atomic sensor system about a sensitive axis.

5. The system of claim 1, wherein the beam optics comprises:
   a half-wave plate and a linear polarizer configured to convert the optical probe beam to a predetermined linear polarization;
   a polarizing beam-splitter configured to pickoff a portion of the optical probe beam having the predetermined linear polarization; and
   a photodetector configured to receive the portion of the optical probe beam and to generate a reference signal corresponding to a reference intensity of the optical probe beam.

6. The system of claim 1, wherein the photodetector assembly comprises a polarizing beam-splitter, a first photodetector, and a second photodetector, wherein the polarizing beam-splitter is configured to separate the optical probe beam exiting the sensor cell into first and second orthogonal signal components, wherein the first and second photodetectors are configured to generate first and second intensity signals corresponding to the first and second orthogonal signal components, respectively, and wherein the first and second intensity signals are provided as a difference signal corresponding to the feedback signal that is indicative of the Faraday rotation of the optical probe beam exiting the sensor cell.

7. The system of claim 1, wherein the laser controller is configured to substantially lock the center frequency of the optical probe beam at a Faraday rotation peak that is functionally related to a wavelength of the optical probe beam based on variation of the Faraday rotation as a function of the modulated frequency of the optical probe beam.

8. An NMR gyroscope system comprising the atomic sensor system of claim 1.

9. An atomic magnetometer system comprising the atomic sensor system of claim 1.

10. A method for stabilizing a frequency of an optical probe beam in an atomic sensor system, the method comprising:
   modulating the frequency of the optical probe beam about a center frequency based on a modulation signal;
   generating a magnetic field along an axis;
   splitting the optical probe beam into a first portion and a second portion;
   directing the first portion of the optical probe beam substantially orthogonally relative to the axis for measuring at least one of an external magnetic field, a spin precession frequency or phase, and a rotation of the atomic sensor system about a sensitive axis;
   combining the second portion of the optical probe beam collinearly with an optical pump beam that is provided along the axis and which is configured to stimulate an alkali metal vapor in a sensor cell of the atomic sensor system;
   measuring a Faraday rotation associated with the second portion of the optical probe beam exiting the sensor cell;
   generating a feedback signal based on the Faraday rotation associated with the optical probe beam exiting the sensor cell;
   demodulating the optical probe beam exiting the sensor cell based on the modulation signal; and
   stabilizing the center frequency of the optical probe beam based on the feedback signal.

11. The method of claim 10, further comprising:
   providing the optical probe beam through a half-wave plate and a linear polarizer to convert the optical probe beam to a predetermined linear polarization;
   picking-off a portion of the optical probe beam; and
   generating a reference signal corresponding to a reference intensity of the optical probe beam based on the portion of the optical probe beam.

12. The method of claim 10, wherein measuring the Faraday rotation comprises:
   splitting the optical probe beam into a first portion and a second portion, the first and second portions having substantially orthogonal linear polarization states;
   providing the first portion to a first photodetector and providing the second portion to a second photodetector; and
   generating a difference signal associated with a first intensity of the first portion and a second intensity of the second portion, respectively, the difference signal corresponding to the feedback signal that is indicative of the Faraday rotation of the optical probe beam exiting the sensor cell.

13. The method of claim 10, wherein stabilizing the center frequency of the optical probe beam comprises substantially locking the center frequency of the optical probe beam at a Faraday rotation peak that is functionally related to a wavelength of the optical probe beam based on variation of the Faraday rotation as a function of the modulated frequency of the optical probe beam.

14. A nuclear magnetic resonance (NMR) sensor system comprising:
   a magnetic field generator configured to generate a magnetic field along an axis;
   a pump laser configured to generate an optical pump beam along the axis through a sensor cell comprising an alkali metal vapor;
   a probe laser configured to generate an optical probe beam;
   beam optics configured to split the optical probe beam into a first portion and a second portion, and to direct the first portion through the sensor cell substantially orthogonally with respect to the axis;
   a beam combiner configured to combine the second portion of the optical probe beam with the optical pump beam, such that the second portion of the optical probe beam and the optical pump beam are provided substantially collinearly through the sensor cell along the axis;
   a first photodetector assembly configured to measure at least one characteristic associated with the first portion of the optical probe beam exiting the sensor cell for measurement of at least one of an external magnetic field, a spin precession frequency or phase, and a rotation of the atomic sensor system about a sensitive axis;
   a second photodetector assembly configured to measure a Faraday rotation associated with the second portion of the optical probe beam exiting the sensor cell and to generate a feedback signal based on the Faraday rotation associated with the optical probe beam exiting the sensor cell; and
   a laser controller configured to modulate a frequency of the optical probe beam about a center frequency and to substantially stabilize the center frequency of the optical probe beam based on the feedback signal.

15. The system of claim 14, wherein the beam optics comprises:

a half-wave plate and a linear polarizer configured to convert the optical probe beam to a predetermined linear polarization;

a polarizing beam-splitter configured to pickoff a portion of the optical probe beam having the predetermined linear polarization; and a photodetector configured to receive the portion of the optical probe beam and to generate a reference signal corresponding to a reference intensity of the optical probe beam.

16. The system of claim 14, wherein the second photodetector assembly comprises a polarizing beam-splitter, a first photodetector, and a second photodetector, wherein the polarizing beam-splitter is configured to separate the second portion of the optical probe beam exiting the sensor cell into first and second orthogonal signal components, wherein the first and second photodetectors are configured to generate first and second intensity signals corresponding to the first and second orthogonal signal components, respectively, and wherein the first and second intensity signals are provided as a difference signal corresponding to the feedback signal that is indicative of the Faraday rotation of the optical probe beam exiting the sensor cell.

17. The system of claim 14, wherein the laser controller is configured to substantially lock the center frequency of the optical probe beam at a Faraday rotation peak that is functionally related to a wavelength of the optical probe beam based on variation of the Faraday rotation as a function of the modulated frequency of the optical probe beam.

\* \* \* \* \*